United States Patent
Boo et al.

(10) Patent No.: US 10,236,568 B2
(45) Date of Patent: Mar. 19, 2019

(54) CURVE-TYPED RIGID BOARD AND THREE DIMENSIONAL ANTENNA HAVING CURVE-TYPED RIGID BOARD

(71) Applicant: HANSOL TECHNICS INC., Seoul (KR)

(72) Inventors: Jae-Ho Boo, Seoul (KR); Chi-Young Choi, Uiwang-si (KR)

(73) Assignee: HANSOL TECHNICS INC., Seoul (KR)

( * ) Notice: Subject to any disclaimer, the term of this patent is extended or adjusted under 35 U.S.C. 154(b) by 0 days.

(21) Appl. No.: 15/567,817

(22) PCT Filed: Nov. 9, 2015

(86) PCT No.: PCT/KR2015/011983
§ 371 (c)(1),
(2) Date: Oct. 19, 2017

(87) PCT Pub. No.: WO2016/171353
PCT Pub. Date: Oct. 27, 2016

(65) Prior Publication Data
US 2018/0097283 A1 Apr. 5, 2018

(30) Foreign Application Priority Data

Apr. 20, 2015 (KR) ........................ 10-2015-0055325

(51) Int. Cl.
*H05K 1/03* (2006.01)
*H01Q 1/38* (2006.01)
(Continued)

(52) U.S. Cl.
CPC .............. *H01Q 1/38* (2013.01); *H01Q 1/243* (2013.01); *H05K 1/032* (2013.01); *H05K 1/119* (2013.01);
(Continued)

(58) Field of Classification Search
CPC ....... H05K 1/0281; H01Q 1/38; B32B 37/025
(Continued)

(56) References Cited

U.S. PATENT DOCUMENTS 5,449,591 A 9/1995 Sato et al.
2006/0273304 A1* 12/2006 Cok .................... H01L 51/0096
257/40

(Continued)

FOREIGN PATENT DOCUMENTS

JP 2003078324 3/2003
JP 2011255533 12/2011
(Continued)

OTHER PUBLICATIONS

European Search Report—European Application No. 15890019.1, dated Apr. 6, 2018, citing U.S. Pat. No. 5 449 591, KR 460 475 and JP 2003 078324.

(Continued)

*Primary Examiner* — Tuan T Dinh
(74) *Attorney, Agent, or Firm* — Cantor Colburn LLP (57) ABSTRACT

The curved-type rigid board includes: a main sheet layer capable of maintaining a curved state with a certain curvature; a first adhesive layer formed on the main sheet layer; a sub sheet layer bonded onto the main sheet layer by the first adhesive layer while the sub sheet layer forms a line structure having diagonal lines, which do not match directions of horizontal and vertical lines of the mesh structure of the thermosetting resin of which the main sheet layer is made, in order for the main sheet layer to have rigidity to maintain the curved state; a second adhesive layer formed on the sub sheet layer; and a pattern forming layer bonded onto the sub sheet layer by the second adhesive layer.

11 Claims, 6 Drawing Sheets

(51) Int. Cl.
    *H01Q 1/24*    (2006.01)
    *H05K 3/06*    (2006.01)
    *H05K 3/22*    (2006.01)
    *H05K 3/40*    (2006.01)
    *H05K 1/11*    (2006.01)
    *H05K 3/00*    (2006.01)

(52) U.S. Cl.
    CPC ............. *H05K 3/0014* (2013.01); *H05K 3/06* (2013.01); *H05K 3/22* (2013.01); *H05K 3/4038* (2013.01); *H05K 2201/0145* (2013.01); *H05K 2201/0154* (2013.01); *H05K 2201/0355* (2013.01); *H05K 2201/09018* (2013.01); *H05K 2203/0759* (2013.01)

(58) Field of Classification Search
    USPC .................. 361/760–763, 767, 782–784; 174/254–261
    See application file for complete search history.

(56) References Cited

U.S. PATENT DOCUMENTS

| | | | | |
|---|---|---|---|---|
| 2008/0088056 | A1* | 4/2008 | Vavra | B28B 7/364 264/213 |
| 2010/0066683 | A1* | 3/2010 | Chang | B32B 37/025 345/173 |
| 2011/0278046 | A1* | 11/2011 | Kyhl | H05K 1/0281 174/254 |
| 2012/0222889 | A1* | 9/2012 | Davis | C08G 18/345 174/254 |
| 2014/0002176 | A1* | 1/2014 | Guard | H03K 17/962 327/517 |
| 2014/0144491 | A1* | 5/2014 | Galliano | B29C 37/0078 136/252 |
| 2014/0218869 | A1* | 8/2014 | Yamanaka | H05K 3/0058 361/707 |
| 2017/0125890 | A1* | 5/2017 | Jeong | H01Q 1/38 |

FOREIGN PATENT DOCUMENTS

| | | |
|---|---|---|
| KR | 20070087981 | 8/2007 |
| KR | 20100079336 | 7/2010 |
| KR | 101460475 | 11/2014 |
| KR | 20140130368 | 11/2014 |

OTHER PUBLICATIONS

International Search Report—PCT/KR2015/011983 dated Feb. 23, 2016.

PCT Written Opinion—PCT/KR2015/011983 dated Feb. 23, 2016, citing KR 10-2007-0087981 and KR 10-1460475.

\* cited by examiner

FIG. 9

CURVE-TYPED RIGID BOARD AND THREE DIMENSIONAL ANTENNA HAVING CURVE-TYPED RIGID BOARD

TECHNICAL FIELD

The present invention relates to a curved-type rigid board that is molded using a mold to form a three-dimensional antenna, and more particularly, to a curved-type rigid board (i.e., a curved-type rigid PCB) capable of maintaining a curved state with a certain curvature and a method of manufacturing a three-dimensional antenna applied to a curved portion of a portable terminal by means of the curved-type rigid board.

BACKGROUND ART

Generally, portable terminals are becoming one of essential electronic devices. In particular, mobile communication terminals specialized for voice or video calls among portable terminals are rapidly being developed and, in recent years, tend to evolve into smartphones capable of Internet communication.

Portable terminals are being developed to reduce the volume or weight of modules other than displays in order to provide high portability, which is an original purpose thereof. Portable terminals may perform voice calls or video calls. To this end, the portable terminals essentially have to have antennas.

Antennas used for communication have evolved from an external antenna, which protrudes from a terminal, to an internal antenna, which is built in a terminal, in order to enhance portability and also rule out the risk of breakage.

Also, internal antennas are evolving to reduce an antenna mounting space as they evolve from operating in a single frequency band to operating in two or more frequency bands, that is, in multiple bands. As a result, a three-dimensional (3D) antenna apparatus disclosed in Korean Patent No. 10-1460475 (published on Nov. 10, 2014) was filed. A curved-type rigid board was applied to such a 3D antenna, and first and second antenna patterns and a connection pattern were formed on the rigid board.

The present invention was derived by the applicant improving the formerly registered patent. The applicant filed this application to disclose a method of more clearly manufacturing a 3D antenna by means of a curved-type rigid board in detail.

DETAILED DESCRIPTION OF THE INVENTION

Technical Problem

The present invention is intended to easily achieve application of a 3D antenna to a portable device by means of a curved-type rigid board capable of maintaining a curved state with a certain curvature.

Technical Solution

A curved-type rigid board of the present invention includes a main sheet layer capable of maintaining a curved state with a certain curvature; a first adhesive layer formed on the main sheet layer; and a pattern forming layer bonded onto the main sheet layer by the first adhesive layer.

According to another aspect, the curved-type rigid board includes a main sheet layer capable of maintaining a curved state with a certain curvature; a first adhesive layer formed on the main sheet layer; a sub sheet layer bonded onto the main sheet layer by the first adhesive layer; a second adhesive layer formed on the sub sheet layer; and a pattern forming layer bonded onto the sub sheet layer by the second adhesive layer.

Also, the pattern forming layer is formed on one or both surfaces of the main sheet layer through the first adhesive layer.

Also, the first adhesive layer, the sub sheet layer, the second adhesive layer, and the pattern forming layer are sequentially bonded onto one or both surfaces of the main sheet layer.

The main sheet layer is made of a thermosetting resin with a mesh structure to be processed from a semi-cured state to a fully-cured state in order to have rigidity sufficient to maintain a curved state with a certain curvature.

Also, the main sheet layer is made of a thermosetting resin with a mesh structure processed to a fully-cured state.

Also, the main sheet layer has a surface on which a coating process is performed by a curable paint being applied in order to have rigidity sufficient to maintain a curved state with a certain curvature.

Also, the thermosetting resin is a prepreg.

Also, the sub sheet layer is made of a thermoplastic resin.

Also, the sub sheet layer is bonded onto the main sheet layer while the sub sheet layer forms a line structure having diagonal lines, which do not match directions of horizontal and vertical lines of the mesh structure of the thermosetting resin of which the main sheet layer is made, in order for the main sheet layer to have rigidity sufficient to maintain a curved state with a certain curvature.

Also, the thermoplastic resin is polyethylene terephthalate (PET) or polyimide (PI).

Also, the pattern forming layer is a metal foil sheet.

Also, the first adhesive layer is a low-temperature bonding sheet or a liquid adhesive.

Also, the second adhesive layer is a bonding sheet or a liquid adhesive.

A method of manufacturing a three-dimensional antenna using the curved-type rigid board includes a first process for forming a first adhesive layer by applying a low-temperature bonding sheet or a liquid adhesive to one or both surfaces of a main sheet layer processed to a semi-cured state; a second process for forming a pattern forming layer by bonding a metal foil sheet onto one or both surfaces of the main sheet layer at a certain bonding temperature through the first adhesive layer formed in the first process; a third process for forming an antenna pattern on one or both surfaces of the main sheet layer by etching the pattern forming layer formed in the second process, at a low temperature; a fourth process for plating a surface of the main sheet layer on which the antenna pattern is formed in the third process; and a fifth process for completing a three-dimensional antenna to which the curved-type rigid board capable of maintaining a curved state with a certain curvature is applied by bending the main sheet layer processed to the semi-cured state on which the antenna pattern is formed in the fourth process and curing the bent main sheet layer at a certain temperature.

Also, when the antenna pattern is formed on one surface of the main sheet layer through the pattern forming layer in the third process, the antenna pattern is a first antenna pattern.

Also, the third process further includes a process of forming the antenna pattern on both surfaces of the main sheet layer through the pattern forming layer; and a process of forming a via hole on the main sheet layer through drilling, wherein the antenna pattern includes a first antenna pattern formed through the pattern forming layer bonded onto one surface of the main sheet layer, a second antenna pattern formed through another pattern forming layer bonded onto the other surface of the main sheet layer, and a connection pattern formed to electrically connect the first and second antenna patterns through a via hole passing through the main sheet layer.

Advantageous Effects

According to the present invention, it is possible to easily apply a 3D antenna to a portable terminal by means of the curved-type rigid board having a curved state with a certain curvature and also maximize space utilization in the portable terminal.

BEST MODE

Advantages and features of the present invention, and implementation methods thereof will be clarified through the following embodiments described with reference to the accompanying drawings. Embodiments of the technical spirit of the present invention may, however, be embodied in various forms and should not be construed as limited to the embodiments set forth herein. Rather, these embodiments are provided so that this disclosure is thorough and complete, and will fully convey the scope of the present invention to those skilled in the art. Also, embodiments of the technical spirit of the present invention are just defined only by the appended claims.

The terminology used herein is for the purpose of describing particular embodiments only and is not intended to be limiting of the present invention. As used herein, the singular forms "a," "an," and "the" are intended to include the plural forms as well, unless the context clearly indicates otherwise.

It will be further understood that the terms "comprises," "comprising," "includes," "including," and/or "having," when used in this specification, specify the presence of stated features, integers, steps, operations, elements, components, or groups thereof, but do not preclude the presence or addition of one or more other features, integers, steps, operations, elements, components, or groups thereof.

Additionally, the embodiments in the detailed description will be described with reference to sectional views and/or plan views as ideal exemplary views of the present invention. In the figures, the dimensions of layers and regions are exaggerated for clarity of illustration. Accordingly, shapes of the exemplary views may be modified according to manufacturing techniques and/or allowable tolerances. Therefore, the embodiments of the present invention are not limited to the shown specific forms, but may include changes in form that are created or needed during the manufacturing process. For example, a region illustrated as a rectangle may be rounded or have a predetermined curvature. Therefore, the regions illustrated in the drawings have schematic properties, and the shapes of the regions illustrated in the drawings are illustrative of specific shapes of regions of a device and are not intended to limit the scope of the present invention.

Like reference numerals refer to like elements throughout. Therefore, although like reference numerals or similar reference numerals are not mentioned or described in the drawing, it will be described with reference to the other drawings. Furthermore, although reference numerals are not illustrated, it will be described with reference to the other drawings.

Hereinafter, embodiments of the present invention will be described with reference to the accompanying drawings.

Figure 1:
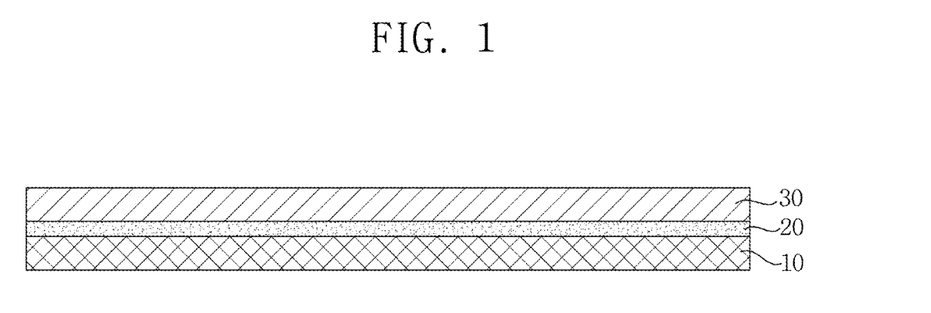
FIG. 1 is a schematic sectional view of a curved-type rigid board having a pattern forming layer on one surface of a main sheet layer according to a first embodiment of the present invention.

FIG. 1 shows a schematic sectional view of a curved-type rigid board having a pattern forming layer on one surface of a main sheet layer according to a first embodiment of the present invention.

Referring to FIG. 1, a curved-type rigid board A according to the first embodiment of the present invention includes a main sheet layer 10, a first adhesive layer 20, and a pattern forming layer 30.

The main sheet layer 10 is made of a thermosetting resin with a mesh structure to be processed from a semi-cured state to a fully-cured state in order to have rigidity to maintain a curved state with a certain curvature. The thermosetting resin has a prepreg applied for convenience of molding.

Here, the main sheet layer 10 has a surface on which a coating process is performed by a curable paint being applied in order to have rigidity sufficient to maintain a curved state with a certain curvature.

The first adhesive layer 20 is formed on one surface of the main sheet layer 10. The first adhesive layer 20 is a low-temperature bonding sheet that is attached to one surface of the main sheet layer 10 or a liquid adhesive that is applied to one surface of the main sheet layer 10.

Here, the bonding sheet or the adhesive has a bonding temperature of 150° C. or lower.

The pattern forming layer 30 is a metal (e.g., Cu) foil sheet. The pattern forming layer is bonded onto one surface of the main sheet layer 10 by the first adhesive layer 20 in order to form an antenna pattern P10 through an etching process during manufacturing of a 3D antenna. The antenna pattern P10 is a first antenna pattern P11.

In the first embodiment of the present invention, the pattern forming layer 30 has been described as being formed on only one surface of the main sheet layer 10 in the curved-type rigid board A. In a second embodiment of the present invention, however, referring to FIG. 2, pattern forming layers 30 and 30' may be formed on both surfaces of the main sheet layer 10. The same elements as described in the first embodiment of the present invention will be described using the same reference numerals, and thus a repeated description thereof will be omitted.

Figure 2:
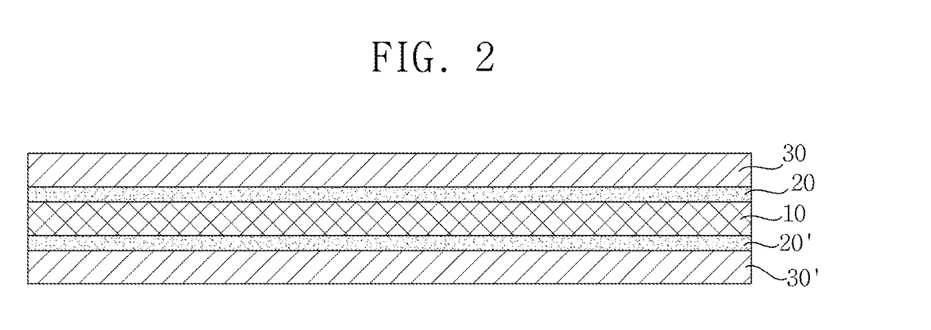
FIG. 2 is a schematic sectional view of a curved-type rigid board having a pattern forming layer on both surfaces of a main sheet layer according to a second embodiment of the present invention.

That is, in the second embodiment, a curved-type rigid board A having a curved state with a certain curvature may be formed by forming first adhesive layers 20 and 20' made of a low-temperature bonding sheet or a liquid adhesive on both surfaces of a main sheet layer 10 molded of a thermosetting resin with a mesh structure to be processed from a semi-cured state to a fully-cured state in order to have rigidity sufficient to maintain a curved state with a certain curvature, and then bonding pattern forming layers 30 and 30' made of a metal (e.g., Cu) foil sheet onto the first adhesive layers 20 and 20'.

Figure 3:
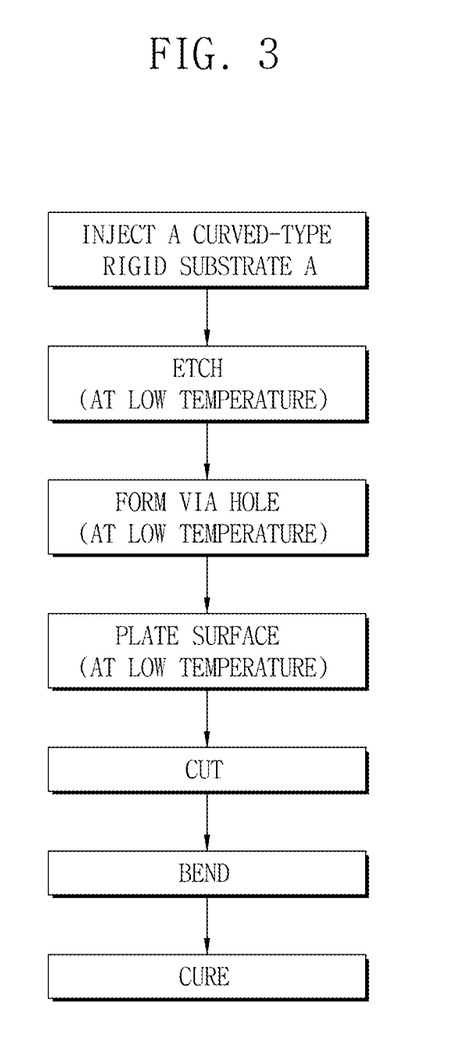
FIG. 3 is a flowchart of a process of manufacturing a 3D antenna using a curved-type rigid board having an antenna pattern on one or both surfaces of a main sheet layer according to first and second embodiments of the present invention.

Meanwhile, a manufacturing method of a 3D antenna by means of the curved-type rigid board A will be described with reference to FIGS. 1 to 3. First, a first adhesive layer 20 or first and second adhesive layers 20 and 20' are formed by applying a bonding sheet or a liquid adhesive to one or both surfaces of a main sheet layer 10 processed to a semi-cured state.

Subsequently, a pattern forming layer 30 or pattern forming layers 30 and 30' are formed by bonding a metal foil sheet onto one or both surfaces of the main sheet layer 10 at a certain bonding temperature (e.g., 150° C. or lower) through the first adhesive layer 20 or the first and second adhesive layers 20 and 20'.

Subsequently, an antenna pattern P10 including a first antenna pattern P11 is formed on one surface of the main sheet layer 10 or an antenna pattern P10 including first and second antenna patterns P11 and P12, a via hole, and a connection pattern P13 is formed on both surfaces of the main sheet layer 10, by etching the pattern forming layer 30 or the pattern forming layers 30 and 30' at a low temperature (e.g., at room temperature or 50° C.).

Figure 8:
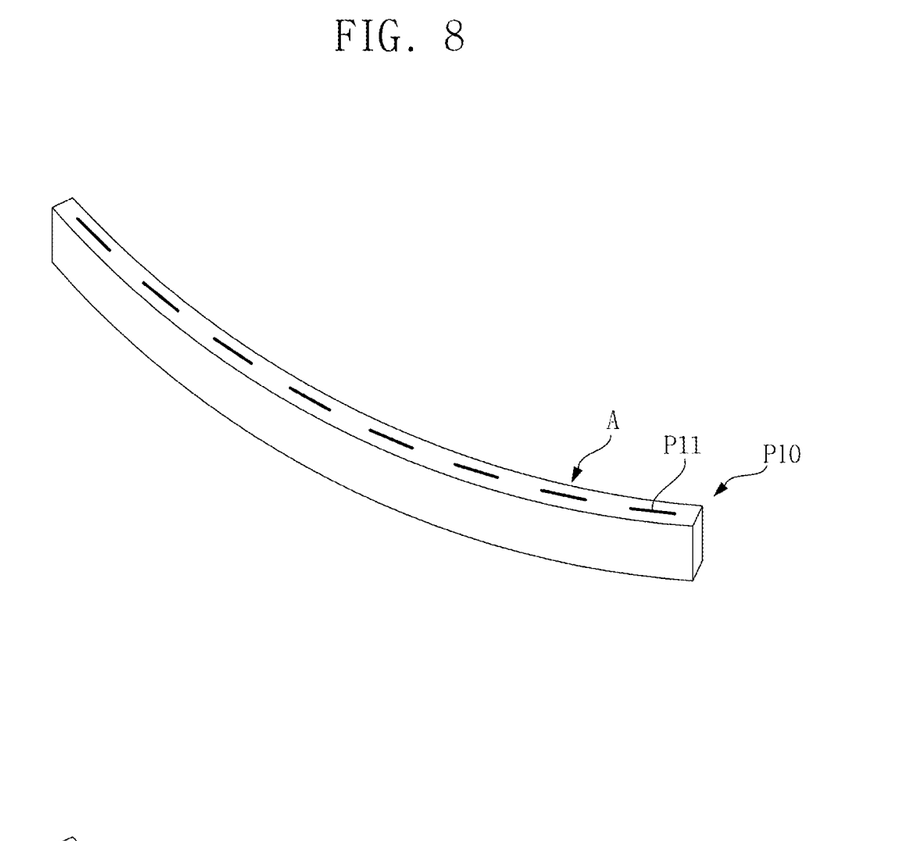
FIG. 8 is a perspective view of a 3D antenna structure to which a curved-type rigid board having an antenna pattern formed on one surface is applied according to an embodiment of the present invention.
Figure 9:
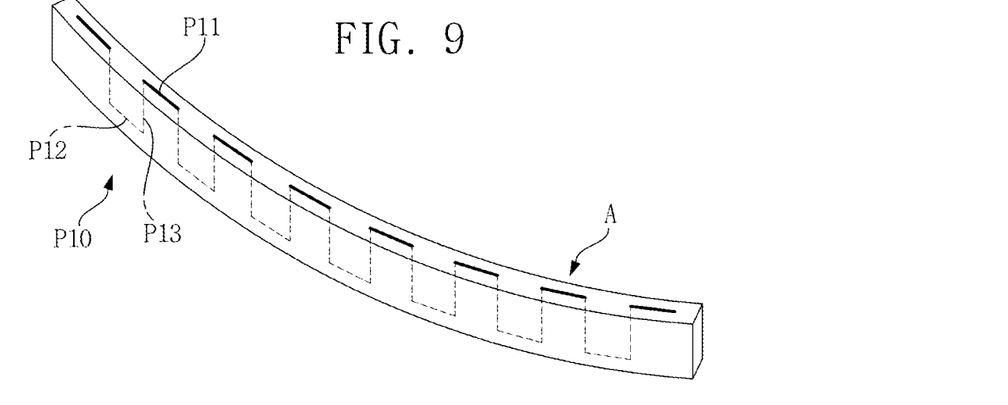
FIG. 9 is a perspective view of a 3D antenna structure to which a curved-type rigid board having an antenna pattern formed on both surfaces is applied according to an embodiment of the present invention.

Subsequently, by plating the surface of the main sheet layer 10 on which the antenna pattern P10 is formed, cutting the main sheet layer 10 to a certain size, bending the main sheet layer 10 having the antenna pattern P10 formed on one or both surfaces, and curing the main sheet layer 10 at a certain temperature (e.g., at 120° C.), it is possible to complete a 3D antenna to which the curved-type rigid board A capable of maintaining a curved state with a certain curvature is applied through secondary curing of the main sheet layer 10 processed to a semi-cured state, as shown in FIGS. 8 and 9.

Here, the via hole is formed on the main sheet layer 10 through drilling. When the antenna pattern P10 is formed on one or both surfaces of the main sheet layer 10 of the curved-type rigid board by using the pattern forming layer 30 or the pattern forming layers 30 and 30', an external terminal of conductive material may typically be attached or soldered to the antenna pattern P10 or any one of an inductor device and a capacitor device may be electrically connected to the antenna pattern P10.

MODE OF THE INVENTION

Figure 4:
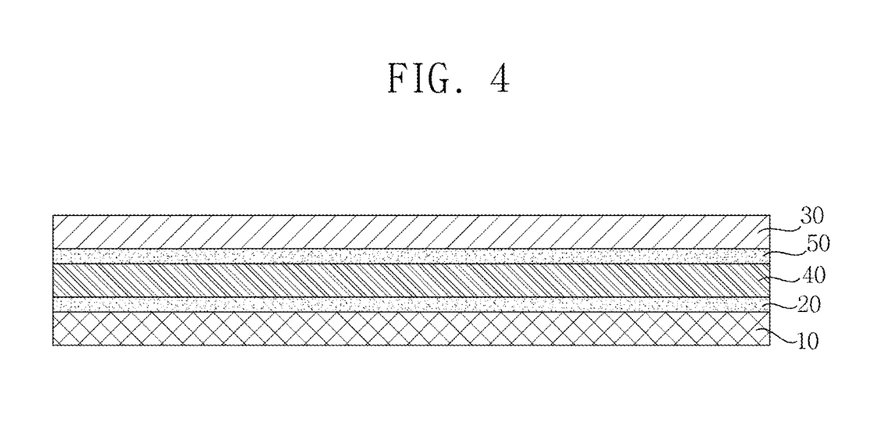
FIG. 4 is a schematic sectional view of a curved-type rigid board having a pattern forming layer on one surface of a sub sheet layer bonded onto a main sheet layer according to a third embodiment of the present invention.

FIG. 4 shows a curved-type rigid board according to a third embodiment of the present invention. Here, a first adhesive layer 20 made of a bonding sheet or a liquid adhesive is formed on one surface of a main sheet layer 10 capable of maintaining a curved state with a certain curvature, and then a sub sheet layer 40 made of a thermoplastic resin, such as polyethylene terephthalate (PET) or polyimide (PI), is bonded onto the first adhesive layer 20.

Also, a second adhesive layer 50 made of a bonding sheet or a liquid adhesive is formed on the sub sheet layer 40, and then a pattern forming layer 30 for forming an antenna pattern P10 is bonded onto the second adhesive layer 50.

Here, the main sheet layer 10 has a surface on which a coating process is performed by a curable paint being applied in order to have rigidity sufficient to maintain a curved state with a certain curvature.

That is, according to the third embodiment of the present invention, the first adhesive layer 20, the sub sheet layer 40, the second adhesive layer 50, and the pattern forming layer 30 for forming the antenna pattern P10 are sequentially bonded onto one surface of the main sheet layer 10.

Here, the antenna pattern P10 is formed on the sub sheet layer 40 by etching the pattern forming layer 30 through a manufacturing process for a 3D antenna, and the antenna pattern P10 is a first antenna pattern P11.

Figure 5:
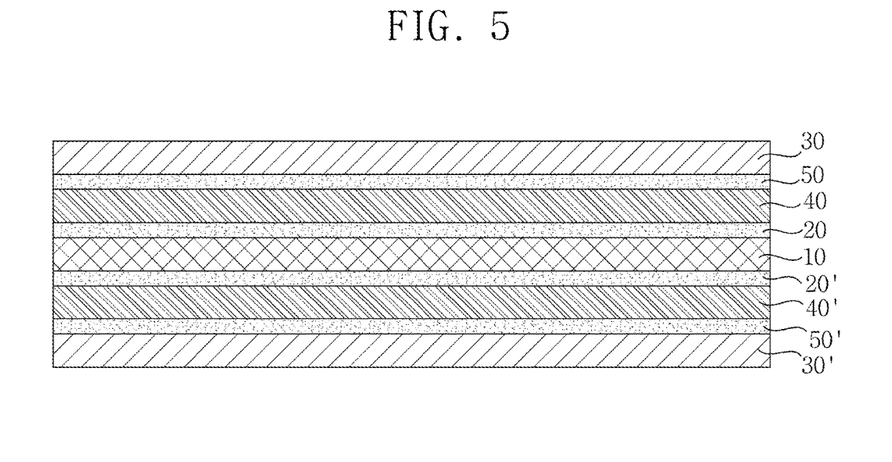
FIG. 5 is a schematic sectional view of a curved-type rigid board having a pattern forming layer on both surfaces of a sub sheet layer bonded onto a main sheet layer according to a fourth embodiment of the present invention.

Also, FIG. 5 shows a fourth embodiment, in which first adhesive layers 20 and 20', sub sheet layers 40 and 40', second adhesive layers 50 and 50', and pattern forming layers 30 and 30' are sequentially bonded onto both surfaces of a main sheet layer 10. The same elements as described in the third embodiment of the present invention will be described using the same reference numerals, and thus a repeated description thereof will be omitted.

Figure 6:
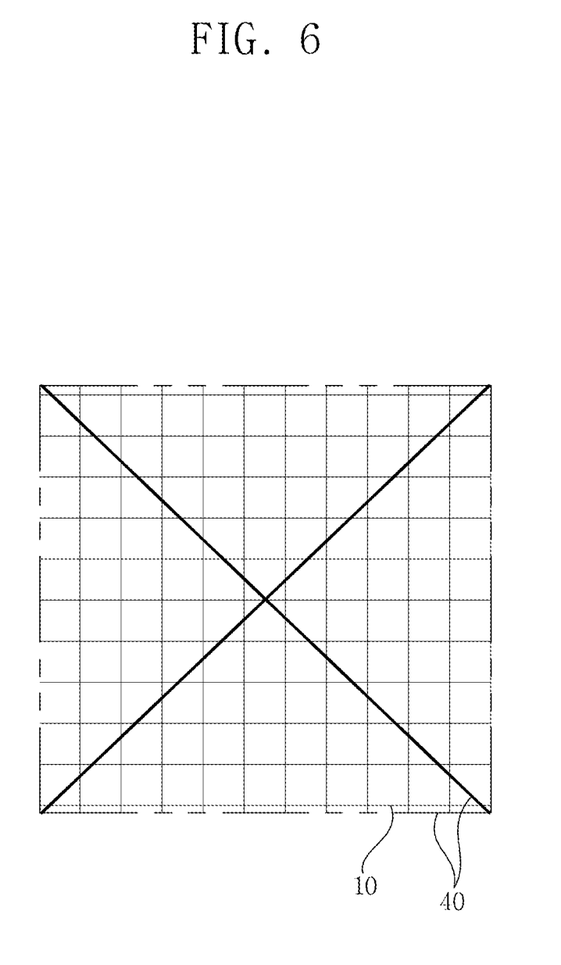
FIG. 6 is a schematic plan view showing a configuration of a sub sheet layer with a line structure having diagonal lines, which do not match directions of horizontal and vertical lines of a mesh structure of a main sheet layer, the sub sheet layer being bonded onto the main sheet layer according to third and fourth embodiments of the present invention.
Figure 7:
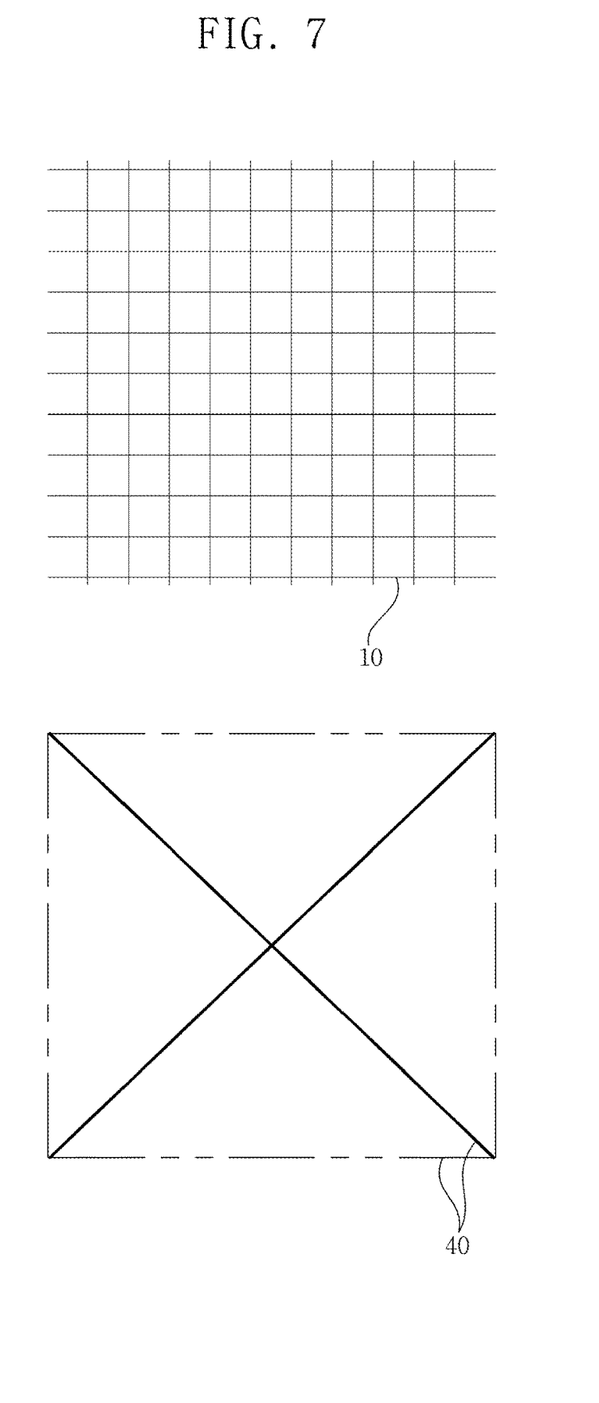
FIG. 7 is a view showing the main sheet layer and the sub sheet layer of FIG. 6 being separated from each other according to an embodiment of the present invention.

Here, the main sheet layer 10 has a mesh structure. When the sub sheet layer 40 or the sub sheet layers 40 and 40' are bonded onto one or both surfaces of the main sheet layer 10 by using the first adhesive layer 20 or the first adhesive layers 20 and 20', the sub sheet layer 40 or the sub sheet layers 40 and 40' are bonded onto the main sheet layer 10 while the sub sheet layer 40 or the sub sheet layers 40 and 40' have a line structure having diagonal lines, which do not match directions of horizontal and vertical lines of the mesh structure of the thermosetting resin of which the main sheet layer 10 is made, as shown in FIGS. 6 and 7. This is for the main sheet layer 10 to have rigidity sufficient to maintain a curved state with a certain curvature.

Although the technical spirit of the curved-type rigid board and the manufacturing method thereof according to the present invention has been described with reference to the accompanying drawings, the above-description illustrates preferred embodiments of the present invention and does not limit the present invention.

Therefore, the present invention is not limited to the aforementioned embodiments. It will be appreciated by those skilled in the art that various modifications and variations may be made to the described embodiments without departing from the essence of the present invention as defined by the following claims, and also all such modifications and variations are within the scope of the appended claims.

INDUSTRIAL APPLICABILITY

According to the present invention, it is possible to easily apply a 3D antenna to a portable terminal by means of the curved-type rigid board having a curved state with a certain curvature.

The invention claimed is:

1. A curved-type rigid board comprising:
   a main sheet layer capable of maintaining a curved state with a certain curvature, wherein the main sheet layer is made of a thermosetting resin with a mesh structure processed to a fully-cured state;
   a first adhesive layer formed on the main sheet layer;
   a sub sheet layer bonded onto the main sheet layer by the first adhesive layer while the sub sheet layer forms a line structure having diagonal lines, which do not match directions of horizontal and vertical lines of the mesh structure of the thermosetting resin of which the main sheet layer is made, in order for the main sheet layer to have rigidity to maintain the curved state;
   a second adhesive layer formed on the sub sheet layer; and
   a pattern forming layer bonded onto the sub sheet layer by the second adhesive layer.

2. The curved-type rigid board of claim 1, wherein the first adhesive layer, the sub sheet layer, the second adhesive layer, and the pattern forming layer are sequentially bonded onto one or both surfaces of the main sheet layer.

3. The curved-type rigid board of claim 1, wherein the thermosetting resin is a prepreg.

4. The curved-type rigid board of claim 1, wherein the main sheet layer has a surface on which a coating process is performed by a curable paint being applied in order to have rigidity to maintain the curved state.

5. The curved-type rigid board of claim 1, wherein the sub sheet layer is made of a thermoplastic resin.

6. The curved-type rigid board of claim 1, wherein the pattern forming layer is a metal foil sheet.

7. The curved-type rigid board of claim 1, wherein the first adhesive layer and the second adhesive layer are each a bonding sheet or a liquid adhesive.

8. The curved-type rigid board of claim 5, wherein the thermoplastic resin is polyethylene terephthalate (PET) or polyimide (PI).

9. A three-dimensional antenna having a curved-type rigid board, the curved-type rigid board comprising:
   a main sheet layer capable of maintaining a curved state with a certain curvature, wherein the main sheet layer is made of a thermosetting resin with a mesh structure processed to a fully-cured state;
   a first adhesive layer formed on one surface of the main sheet layer;
   a first sub sheet layer bonded onto the one surface of the main sheet layer by the first adhesive layer while the first sub sheet layer forms a line structure having diagonal lines, which do not match directions of horizontal and vertical lines of the mesh structure of the thermosetting resin of which the main sheet layer is made, in order for the main sheet layer to have rigidity to maintain the curved state;
   a second adhesive layer formed on the first sub sheet layer; and
   a first pattern forming layer bonded onto the first sub sheet layer by the second adhesive layer, wherein the first pattern forming layer comprises: a first antenna pattern.

10. The three-dimensional antenna claim 9, wherein the curved-type rigid board further comprises: a third adhesive layer, a second sub sheet layer, a fourth adhesive layer, and a second pattern forming layer are sequentially bonded onto the other surface opposite to the one surface of the main sheet layer, and the second pattern forming layer comprises: a second antenna pattern.

11. The three-dimensional antenna claim 10, wherein the curved-type rigid board further comprises: a via hole formed through the main sheet layer and a connection line formed in the via hole, and the first antenna pattern and the second antenna pattern are electrically connected with each other by the connection line.

* * * * *